(12) United States Patent
Van Gemert et al.

(10) Patent No.: US 8,987,057 B2
(45) Date of Patent: Mar. 24, 2015

(54) ENCAPSULATED WAFER-LEVEL CHIP SCALE (WLSCP) PEDESTAL PACKAGING

(71) Applicant: NXP B.V., Eindhoven (NL)

(72) Inventors: Leonardus Antonius Elisabeth Van Gemert, Nijmegen (NL); Tonny Kamphuis, Lent (NL); Hartmut Buenning, Norderstedt (DE); Christian Zenz, Graz (AT)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/021,708

(22) Filed: Sep. 9, 2013

(65) Prior Publication Data
US 2014/0091458 A1    Apr. 3, 2014

Related U.S. Application Data

(60) Provisional application No. 61/826,307, filed on May 22, 2013, provisional application No. 61/708,188, filed on Oct. 1, 2012.

(51) Int. Cl.
| | | |
|---|---|---|
| H01L 21/00 | (2006.01) | |
| H01L 23/544 | (2006.01) | |
| H01L 21/56 | (2006.01) | |
| H01L 21/78 | (2006.01) | |
| H01L 23/28 | (2006.01) | |
| H01L 23/00 | (2006.01) | |
| H01L 23/31 | (2006.01) | |

(52) U.S. Cl.
CPC .............. *H01L 23/28* (2013.01); *H01L 21/561* (2013.01); *H01L 21/568* (2013.01); *H01L 21/78* (2013.01); *H01L 23/3114* (2013.01); *H01L 24/96* (2013.01); *H01L 24/97* (2013.01); *H01L 2224/32245* (2013.01); *H01L 2224/83* (2013.01); *H01L 2224/97* (2013.01)
USPC .......................................... 438/111; 257/620

(58) Field of Classification Search
USPC ............ 438/110–113, 68, 462; 257/620, 782, 257/E21.596, E21.599
See application file for complete search history.

(56) References Cited

U.S. PATENT DOCUMENTS

| | | | | |
|---|---|---|---|---|
| 6,545,332 | B2 * | 4/2003 | Huang ........................... | 257/433 |
| 6,979,594 | B1 * | 12/2005 | Fan et al. ...................... | 438/113 |
| 8,871,571 | B2 * | 10/2014 | Sirinorakul ................... | 438/122 |
| 2013/0157414 | A1 | 6/2013 | Ho et al. | |

* cited by examiner

*Primary Examiner* — Calvin Lee (57) ABSTRACT

Consistent with an example embodiment, there is semiconductor device assembled to resist mechanical damage. The semiconductor device comprises an active circuit defined on a top surface, contact areas providing electrical connection to the active circuit. There is a pedestal structure upon which the active circuit is mounted on an opposite bottom surface; the pedestal structure has an area smaller than the area of the active device. An encapsulation, consisting of a molding compound, surrounds the sides and the underside of the active device and it surrounds the contact areas. The encapsulation provides a resilient surface protecting the active device from mechanical damage. A feature of the embodiment is that the contact areas may have solder bumps defined thereon.

11 Claims, 9 Drawing Sheets

ENCAPSULATED WAFER-LEVEL CHIP SCALE (WLSCP) PEDESTAL PACKAGING

CROSS-REFERENCE TO RELATED APPLICATIONS

This application claims the benefit of U.S. Provisional Application No. 61/708,188 filed on Oct. 1, 2012 and U.S. Provisional Application No. 61/826,307 filed on May 22, 2013 and are incorporated by reference in their entirety.

FIELD

The embodiments of the present invention relate to semiconductor device packaging and, more particularly, to WLCSP packaging having modifications that enhance the manufacturability and quality of products using these WLCSP.

BACKGROUND

The electronics industry continues to rely upon advances in semiconductor technology to realize higher-function devices in more compact areas. For many applications realizing higher-functioning devices requires integrating a large number of electronic devices into a single silicon wafer. As the number of electronic devices per given area of the silicon wafer increases, the manufacturing process becomes more difficult.

The packaging of an IC device is increasingly playing a role in its ultimate performance. For example, in mobile devices (i.e., mobile phones, tablet computers, laptop computers, remote controls, etc), WLCSP components are used in their assembly. WLCSP components save valuable space in the mobile device. After assembly, in some example processes, customers encapsulate these WLCSP devices by injection molding or casing. This manual post-processing of the WLCSP may result in the device being damage. Consequently, the customer may prefer to have the WLCSP product surrounded by non-brittle material, which prevents damage to the die itself, before receiving the product for assembly in to his mobile device.

There is a need for a WLCSP assembly process which can address the challenges raised by the needs of mobile applications.

SUMMARY

The present disclosure has been found useful in the packaging of semiconductor devices which find their way into portable electronic devices. In particular, WLCSP products which are furnished as unpackaged die to manufacturers of mobile devices, who in turn encapsulate these devices directly onto a printed circuit board (in an effort to conserve valuable space in the mobile device) may subject these unpackaged die to rough handling. The handling may result in cracking or other latent damage which may not show up until the mobile device reaches the end user.

The unpackaged die are encapsulated in a resilient material, such as an epoxy molding compound which absorbs the shocks of manual handling during assembly of the mobile device. The process can also be used for CSP with or without solder bumps.

In an example embodiment, there is a method for assembling a wafer level chip scale processed (WLCSP) device having solder balls defined thereon, the method comprises, defining a pedestal mounting strip per WLCSP device die thickness and surface area, the pedestal mounting strip have a topside and an underside. The pedestal mounting strip is fabricated out of a molding compound; the pedestal mounting strip has a grid of pedestals on the topside, each one of the grid pedestals has a surface area smaller than the surface area of the back-side of the WLCSP device. The WLCSP device is die attached onto the surface of each one of the grid pedestals, the WLCSP device forms an overhang on each one of the grid pedestals. Each one of the WLCSP devices on the pedestal mounting strip is encapsulated. The process assures that the encapsulant surrounds the WLCSP devices and flows under the overhang of each WLCSP device.

In another example embodiment, a semiconductor device is assembled to resist mechanical damage, the semiconductor device comprises an active circuit that has solder bumps defined on a top surface, these solder bumps provide electrical connection to the active circuit. There is a pedestal structure upon which the active circuit is mounted on an bottom surface, the pedestal structure has an area smaller than the area of the active device. An encapsulation, consisting of a molding compound, surrounds the sides and the underside of the active device and surrounding the solder balls. The encapsulation provides a resilient surface protecting the active device from mechanical damage.

In an example embodiment, a method for assembling a WLCSP semiconductor device having contact areas defined thereon comprises, defining a pedestal mounting strip per semiconductor device die thickness and surface area, the pedestal mounting strip have a topside and an underside. The pedestal mounting strip is fabricated out of a molding compound, the pedestal mounting strip having a grid of pedestals on the topside, each one of the grid pedestals having a surface area smaller than the surface area of the underside of the semiconductor device. The semiconductor device is die attached onto the surface of each one of the grid pedestals, the semiconductor device forming an overhang on each one of the grid pedestals. With a release foil, the contact areas are protected before encapsulating each one of the WLCSP devices. Each one of the semiconductor devices on the pedestal mounting strip is encapsulated, the user assures the encapsulant surrounds the semiconductor devices and flows under the overhang of each semiconductor device. After encapsulating each one of the WLCSP devices, the release foil is removed. In the corresponding position of the underside of the pedestal mounting strip, each one of the semiconductor devices is marked.

In another example embodiment, there is a method for assembling wafer level chip scale processed (WLCSP) devices from a wafer substrate having a front-side surface upon which solder bumps are defined on active device die and an opposite back-side surface. The method comprises, applying a protection tape on the front-side surface; sawing with a "V-shaped" blade of a first kerf, on the back-side surface of the wafer substrate, in areas corresponding to saw lanes of the active device die, to a depth of about 50% of the wafer substrate thickness; continuing the sawing of the back-side surface with a blade of a second smaller kerf, so as to separate the active device die into singulated device die, wherein each of the singulated device die has an angled recessed profile with respect to the vertical faces of the device die; remounting the singulated device die on their front-side surfaces onto a sawing tape; die bonding the singulated device die onto a pedestal array, the pedestal array having a top-side surface with pre-defined landings for the back-side surface of each of the singulated device die, the pedestal array having a pitch larger than that of the device die; and encapsulating each one of the singulated device die on the pedestal array, and the encapsulant enveloping the WLCSP devices and flowing under the angled recess of each WLCSP device.

The above summaries of the present disclosure are not intended to represent each disclosed embodiment, or every aspect, of the present invention. Other aspects and example embodiments are provided in the figures and the detailed description that follow.

BRIEF DESCRIPTION OF THE DRAWINGS

The invention may be more completely understood in consideration of the following detailed description of various embodiments of the invention in connection with the accompanying drawings, in which.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The disclosed embodiments have been found useful in preventing damage to the Wafer Level Chip-Scale Product (WLCSP) devices during their assembly. The process provides mechanical protection to the silicon device by encapsulating the device in a resilient material. Such a process may be integrated into the customary back-end assembly.

In an example embodiment, the user takes a wafer substrate having devices. The wafer undergoes electrical tests (e.g., E-sort) to sort out non-functioning devices; other processes may forego E-sort and cull out non-functioning devices after packaging. The tested wafers are mounted on an adhesive tape. The wafers are then sawed and separated out into individual device die. Using an appropriate molding apparatus, epoxy mold compound (EMC) is formed into a strip having pedestals. The dimensions (i.e., size, height, etc.) of a formed pedestal are smaller than that of the WLCSP device and are governed by the particular WLCSP product. Thus, the WLCSP device will have an overhanging edge on its underside. The overhang facilitates the flow of encapsulant around the product device and provides an anchor with enhanced strength to the protective encapsulant which seals five or six sides of the device. The individual device die are mounted on the pedestals using suitable die bond techniques. After the device die are mounted, the pedestal strip is over-molded; the molding compound may be the same of different than that used to form the pedestal strip. In some WLCSP devices, solder bumps may have been applied thereon and are protected using a foil-assisted apparatus. Having been sealed in encapsulant, the WLCSP product devices may be laser marked on the side opposite the side having the solder bumps. Saw tape is applied the marked side of the sealed devices; the product devices are then sawed and singulated.

In another example embodiment, the pedestal may be formed within the device die itself. A wafer having device die is mounted on a grinding tape. With a first blade, a wafer having active device die has V-shaped saw marks defined on the backside of the wafer in the X and Y directions of the saw lanes surrounding the active devices. With a second blade, the active device die are sawed apart; the cut is continued from where the V-shape cut left off. A given device die has a pedestal profile on its vertical faces. A strip made of metal, packaging EMC or other suitable material, is made in such a way that its pitch is slightly larger than the size of the device die; a grid of pedestal locations are formed. The pedestal shape enhances the flow of encapsulant around the product and the pedestal shape (i.e., size, height, etc.) which is WLCSP-specific, provides enhanced mechanical anchoring of the encapsulant for either 5 or 6-side encapsulation. Singulated devices are mounted on the grid of pedestal locations and encapsulated. After encapsulation, the devices are sawed apart into separate device now-having a resilient protective material surrounding five or six sides.

Figure 1:
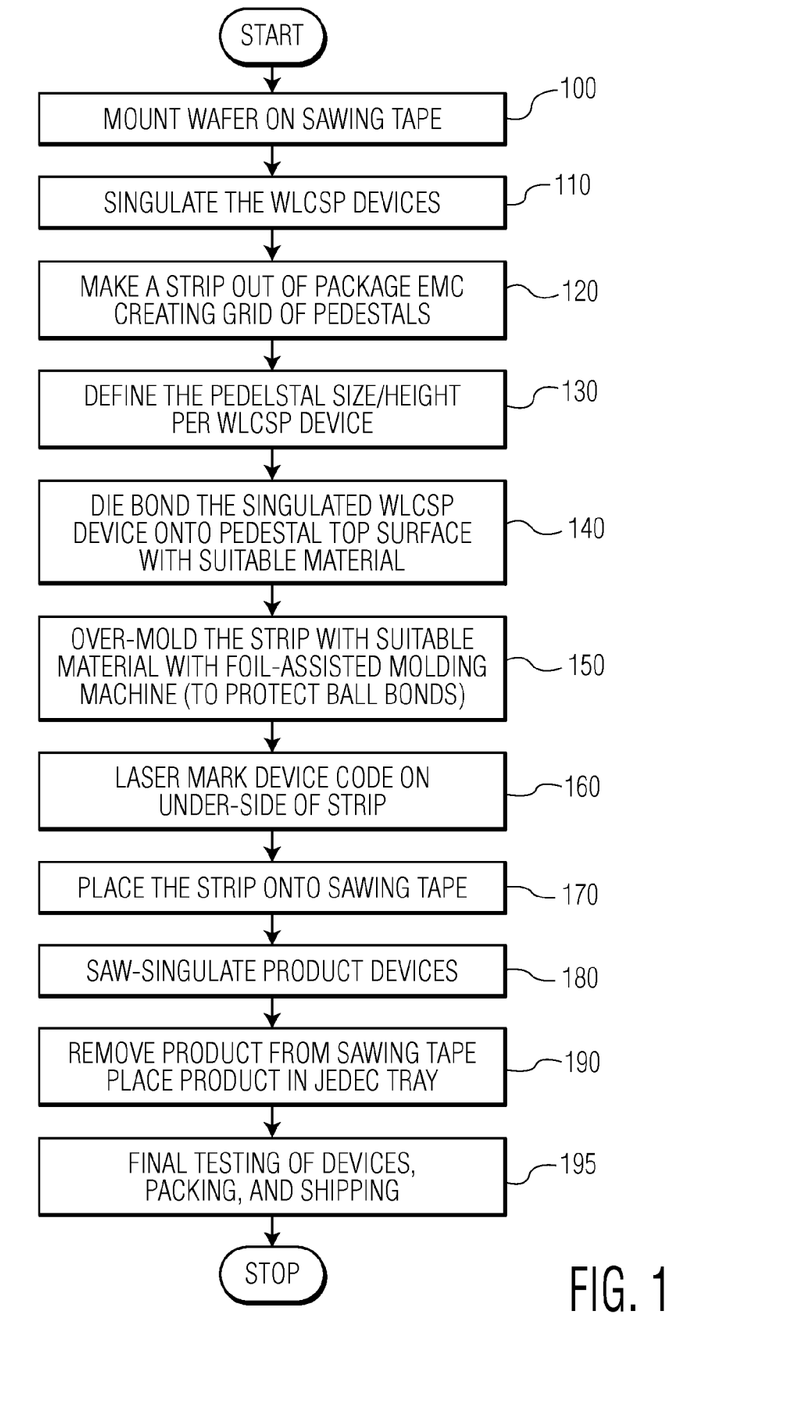
FIG. 1 is a flow diagram of an embodiment according to the disclosure.

Refer to FIG. 1. In an example embodiment according to the present disclosure, a wafer having undergone electrical testing is mounted on a sawing tape 100. Those WLCSP devices which passed electrical testing are separated out (i.e., "singulated") and placed in temporary containers (e.g., "wafer packs") for later use 110. A strip of epoxy mold compound (EMC) or other suitable material is formed into grid of pedestals 120. The size/height of the pedestals is defined by the dimensions of the WLCSP device 130. For mobile applications, the size/height along with WLCSP device dimensions must take into account the limited space available in the given portable electronic device. Having formed the grid of pedestals 120, the singulated WLCSP devices are mounted with a suitable material on the pedestal surfaces 140. The mounting material may include, but is not limited to, wafer backside coating (WBC), die attach film (DAF), or an epoxy. With a suitable apparatus, the pedestal strip is over-molded with a suitable material; a foil-assisted (i.e., release film technology) molding machine may be used to protect those devices using solder balls 150. As required for a given customer, the device code may be marked on the under-side of the strip using a LASER or other suitable technique 160. The strip is placed onto sawing tape 170 on the marked underside. The product devices are separated 180. The protective foil on the solder balls is removed just prior to the singulation. The separated product is removed from the sawing tape; product is placed into appropriate tray (i.e., JEDEC approved, etc.) 190. The devices undergo final electrical testing, packing, and shipping to end user 195.

Figure 2A:
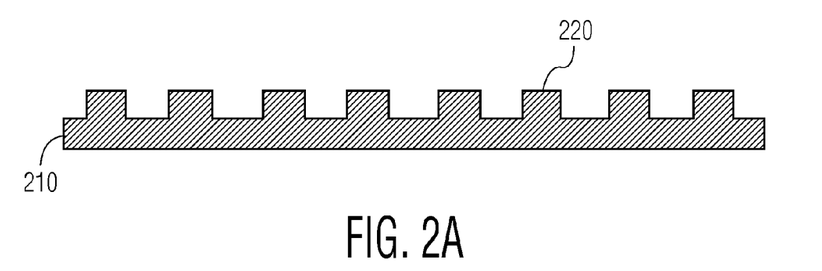
FIGS. 2A-2E illustrates the assembly of an example WLCSP device according an example embodiment.
Figure 2B:
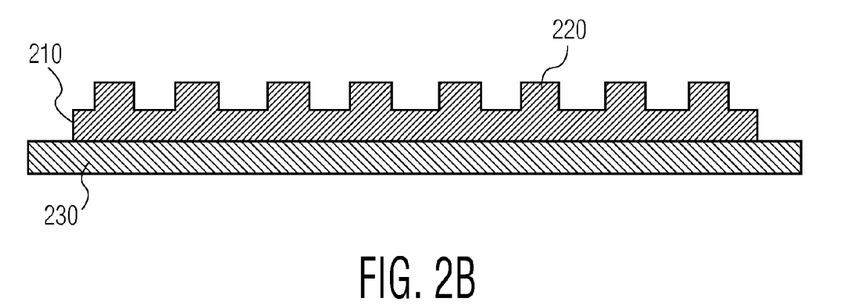

Refer to FIGS. 2A-2B. A strip 210 with pedestals 220 is molded from epoxy mold compound or other material. If backside shielding is required, the cavity strip 210 or the pedestals may be molded onto a metal frame or carrier 230. This metal carrier 230 may serve as RF shielding for the device 240. The size and height of the pedestal is determined by die size and required final package thickness. The shape of the pedestal 220 may be round or square or other suitable shape, as that of a regular polygon of N-sides.

Figure 2C:
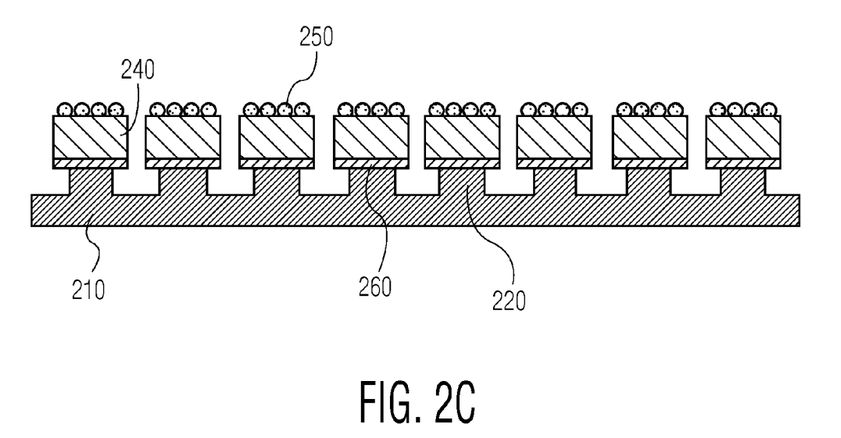

Refer to FIG. 2C. Upon each pedestal 220 is placed a device die 240 with its solder balls 250; the device die 240 is attached to pedestal 220 with a suitable die attach material 260. As mentioned earlier, the die attach material 260 may be wafer backside coating (WBC), die attach film (DAF), or an epoxy. The type of die attach material 260 is governed by the particular process parameters, other suitable types of die attach material in the industry may be applicable to this disclosure, as well.

Figure 2D:
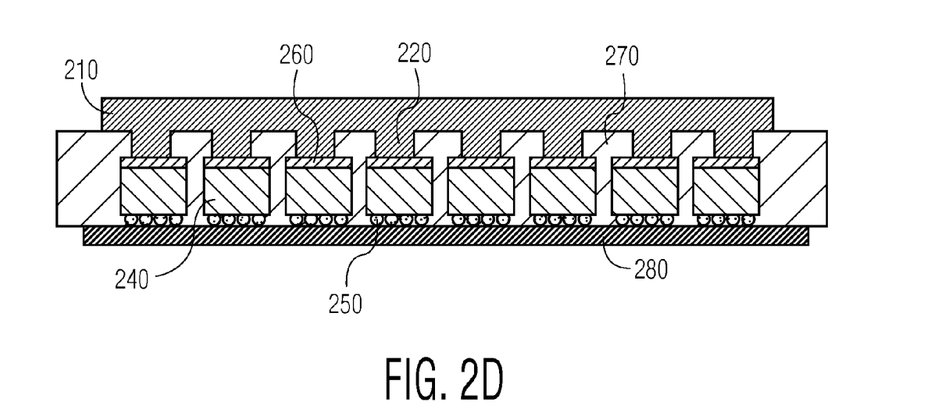

Refer to FIG. 2D. Having attached the device die 240 to the pedestals 220, the solder balls 250 are protected with a release foil 280. An over-mold 270 surrounds the device die 240. Since the die 240 are of larger dimensions than those of the pedestals and forms an overhang, the over-mold compound surrounds the device die 240 and envelopes the overhanging structure. The overhanging structure under the device die 240 serves as an anchor providing enhanced mechanical strength for the molding compound. This molding compound may be the same as that used in the formation of the cavity strip 210 or be a different material.

Figure 2E:
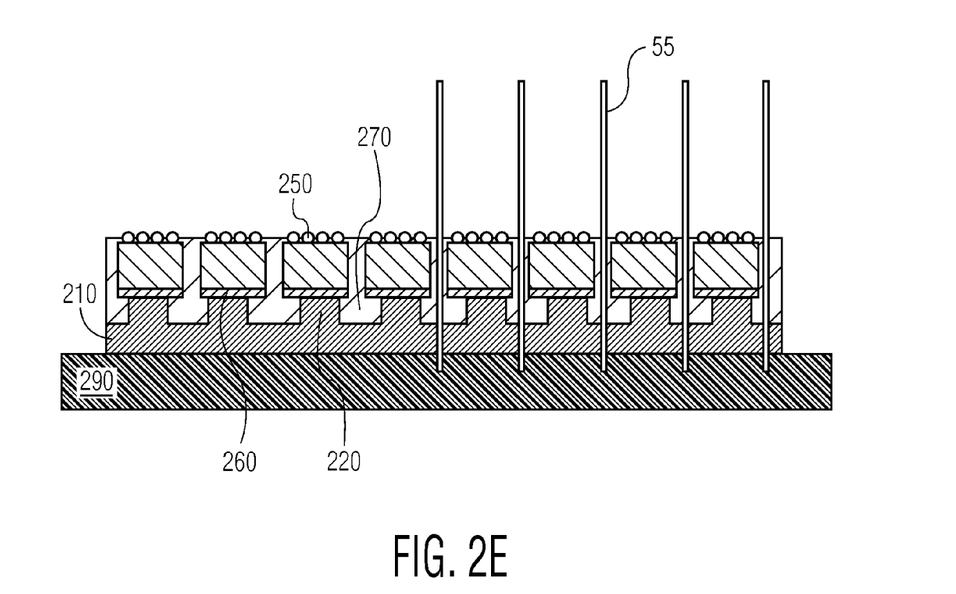

Refer to FIG. 2E. The release foil 280 is removed. The cavity strip 210 with the over-molded devices 240 is placed on an adhesive coated sawing tape 290. Wafer saw 55 cuts the devices 240 to a depth from the solder balls 250 to the adhesive side of the sawing tape 290. The devices 240 are separated into individual devices.

Figure 3A:
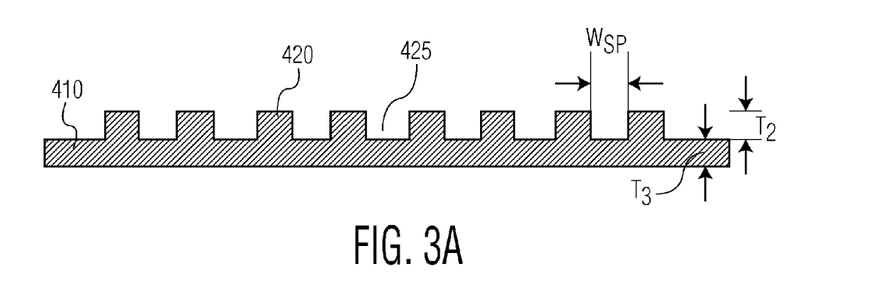
FIGS. 3A-3C illustrate embodiments of pedestal strips used to assemble WLCSP device according to the present disclosure.

In another example embodiment, pedestals of metal may be placed onto a metal strip. In another example embodiment, the pedestals may be manufactured integral to a metal strip. In another example embodiment, the pedestals may be punched into a metal strip. Refer to FIG. 3A. In example embodiment, the pedestal strip 410 with pedestals 420 as used in FIG. 2A may be substituted with a metal strip 430 upon which pedestals 440 may be defined (refer to FIG. 3B). The metal strip 430 may have pedestals 440 integrally defined (i.e., formed, punched, extruded, etc.).

Figure 3B:
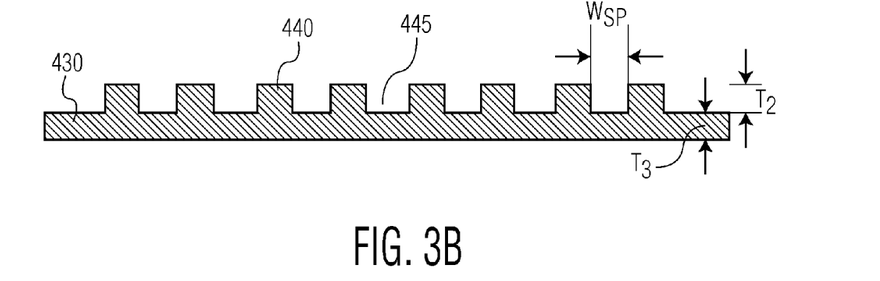
Figure 3C:
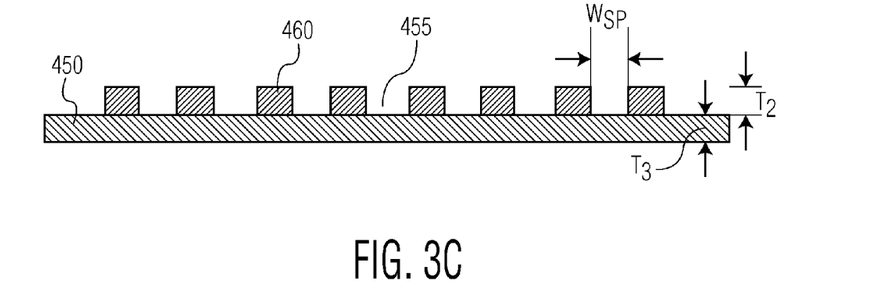

Refer to FIG. 3C. In another example embodiment, a pedestal strip 450 may be molded from epoxy molding compound (EMC) or other suitable polymer material and have pedestals 460 defined thereon; or in another example, the pedestal strip 450 may be metal upon which polymer pedestals 460 are defined. In each of these examples, the spacing ($W_{PS}$) 425, 445, 455 between the pedestals, the pedestal height $T_2$, and pedestal base thickness ($T_3$), are defined by the product device die and end-user requirements. Example dimensions of these pedestal strips are shown in Table 1. In an example embodiment, $T_2$ can range from 0.05 mm to about 0.2 mm. $T_3$ depends on the final total thickness or shielding requirements; $T_3$ may range between about 0.05 mm and about 0.2 mm, as well. The use of metal in the pedestal strip would serve as electrical shielding for the assembled device.

TABLE 1

Dimensions of Example Pedestal Strips/Die Sizes
(Dimensions in mm)

| Type of Strip (FIG.) | Die Size Used ($W_D$) | No. of Die Positions | Pedestal Height ($T_2$) | Pedestal Width ($W_P$) | Pedestal Spacing ($W_{PS}$) |
|---|---|---|---|---|---|
| 3A | 2.5 | 25 × 80 | 0.1 | 2.0 | 1.0 |
| 3A | 4.0 | 15 × 50 | 0.15 | 3.0 | 1.5 |
| 3A | 1 | 50 × 150 | 0.08 | 0.7 | 0.8 |
| 3B | 2.5 | 23 × 76 | 0.1 | 2.0 | 1.25 |
| 3B | 4.0 | 14 × 48 | 0.15 | 3.0 | 1.75 |
| 3B | 1 | 47 × 140 | 0.08 | 0.7 | 1.05 |
| 3C | 2.5 | 23 × 76 | 0.1 | 2.0 | 1.25 |
| 3C | 4.0 | 14 × 48 | 0.15 | 3.0 | 1.75 |
| 3C | 1 | 47 × 140 | 0.08 | 0.7 | 1.05 |

Figure 4A:
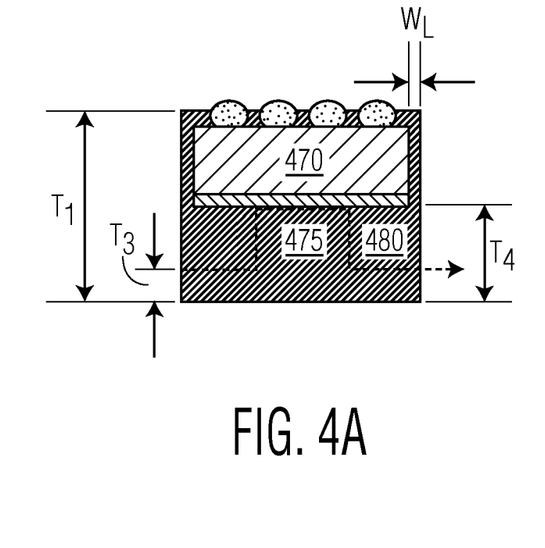
FIGS. 4A-4C illustrate device assembled using the pedestal strips of FIGS. 3A-3C.
Figure 4B:
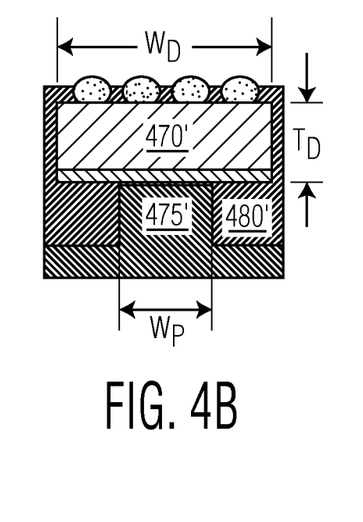
Figure 4C:
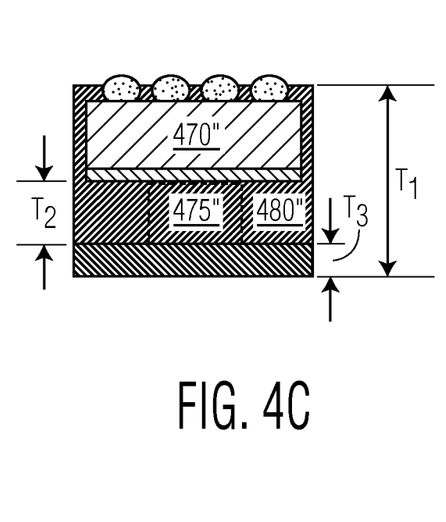

FIGS. 4A-4C depict assembled device die according to the previous discussion. FIG. 4A illustrates a device die 470 mounted and encapsulated on the pedestal strip of FIG. 3A. Device die 470 in mounted on the pedestal 475 of epoxy molding compound (EMC) or equivalent material; device die 470 is encapsulated in additional molding compound 480. FIG. 4B illustrates a device die 470' mounted and encapsulated on the pedestal strip of FIG. 3B. Device die 470' is mounted on the metal pedestal 475'; device die 470' is encapsulated in additional molding compound 480'. FIG. 4C illustrates device die 470" mounted on a pedestal strip of FIG. 3C. The pedestal 475" has a molded pedestal mounted onto a metal substrate; the device die 470" is encapsulated in additional molding compound 480."

FIGS. 4A-4C have dimension lines depicting the measurements of the example device die assembled onto the three example pedestal strips. Refer to Table 2 for some example dimensions for several device die sizes.

TABLE 2

Dimensions of Example Device Die Assembled (Dimensions in mm)

| Type of Device Die | Die Size Used ($W_D$) | Vertical Width Protection ($W_L$) | Overall Thickness ($T_1$) | Pedestal Base Thickness ($T_3$) | Pedestal Height ($T_2$) | Total Pedestal Height ($T_4$) | Pedestal Width ($W_P$) | Device Die Thickness ($T_D$) |
|---|---|---|---|---|---|---|---|---|
| 4A | 2.5 | 0.125 | 0.45 | 0.15 | 0.1 | 0.25 | 2 | 0.2 |
| 4A | 4.0 | 0.125 | 0.5 | 0.20 | 0.15 | 0.35 | 3 | 0.15 |
| 4A | 1 | 0.125 | 0.35 | 0.15 | 0.08 | 0.23 | 0.7 | 0.12 |
| 4B | 2.5 | 0.25 | 0.45 | 0.1 | 0.1 | 0.2 | 2 | 0.25 |
| 4B | 4.0 | 0.25 | 0.45 | 0.1 | 0.15 | 0.25 | 3 | 0.2 |
| 4B | 1 | 0.25 | 0.3 | 0.08 | 0.08 | 0.16 | 0.7 | 0.14 |
| 4C | 2.5 | 0.25 | 0.45 | 0.1 | 0.1 | 0.2 | 2 | 0.25 |
| 4C | 4.0 | 0.25 | 0.45 | 0.1 | 0.15 | 0.25 | 3 | 0.2 |
| 4C | 1 | 0.25 | 0.3 | 0.08 | 0.08 | 0.16 | 0.7 | 0.14 |

Note that $W_L$ is flexible, based on different singulation saw blades used, thus a wide range is possible (as in Table 1), excluding manufacturing tolerances, the range is about 125 µm to about 250 µm.

Figure 5:
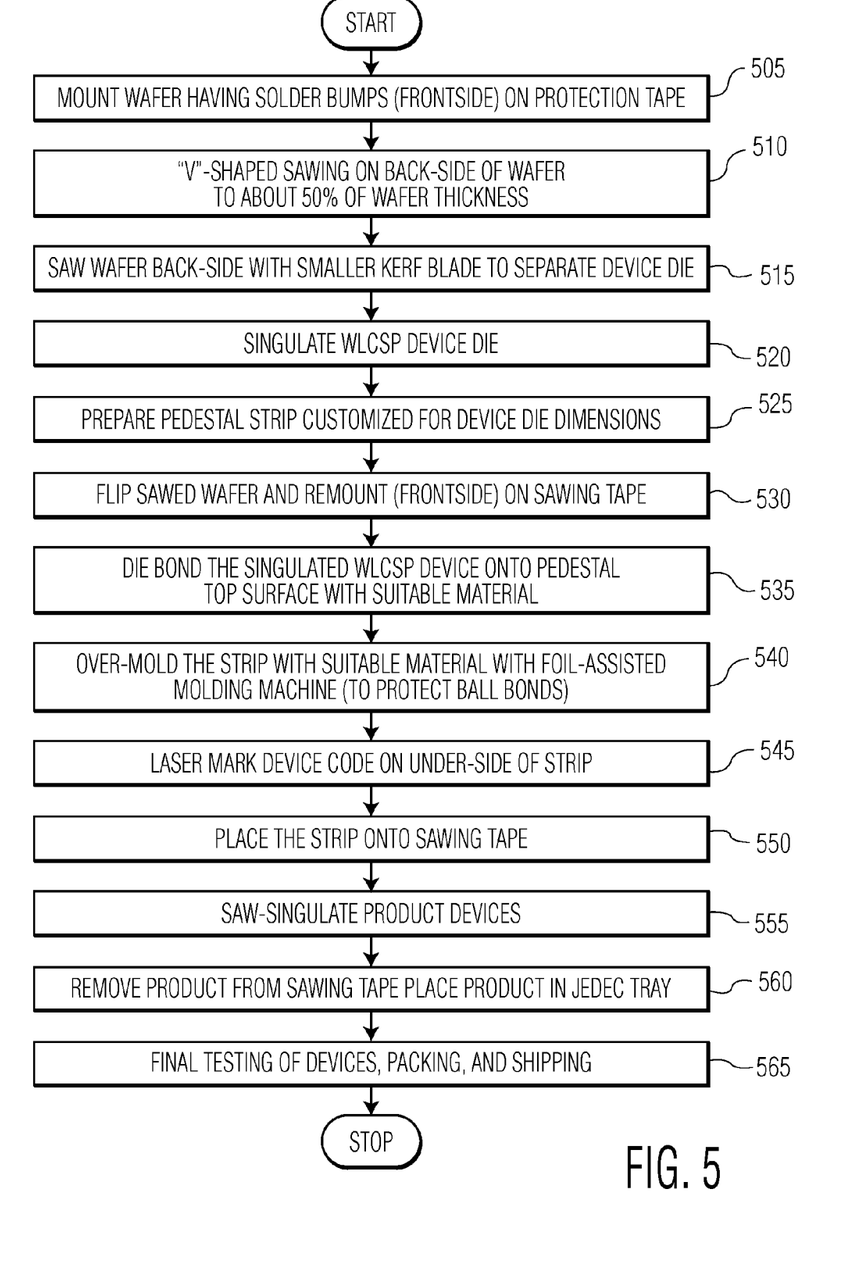
FIG. 5 is a flow diagram of another embodiment according to the disclosure.

In another example embodiment according to the present disclosure, the device die may be fabricated to have a pedestal defined integrally in its structure. Refer to FIG. 5. A wafer having undergone back-grinding has solder bumps applied to the electrical connection areas of active device die on the wafer's front-side surface. The wafer having solder bumps is mounted on the front-side 505 onto a protective tape (which shields the solder bumps from potential damage during subsequent processing). With a "V-shaped" saw blade (or a saw blade with a sloped cutting edge profile) of a first kerf, the back-side of the wafer is sawed on locations corresponding to saw lanes between the active device die 510; the depth of the sawing is about 50% of the wafer thickness. In other processes, other shapes of blades may be used. In an example process, the locations are targeted with an infrared camera (IR) or other suitable imaging system. With a saw blade having a straight profile and a second kerf which is narrower than the first kerf, the device die are sawed apart 515. The sawed-apart die are separated 520. A pedestal strip is prepared that is customized for a given device die's dimensions (i.e., thickness, area, etc.) 525. The separated device die back-side surfaces are die-bonded onto pedestal top-side surfaces with a suitable material 535. Suitable material may include, but not necessary be limited to glue, eutectic die attach, solder, etc. The appropriate material for die bonding would be governed by the pedestal strip material used. Through an over-molding process with a foil-assisted molding apparatus, the bonded device die on the pedestal strip are encapsulated in a resilient molding compound 540. The foil-assisted molding apparatus protects the solder bumps from damage. On the underside of the pedestal strip, the device code may be laser-inscribed 545. The completed pedestal strip having device die is placed onto a sawing tape 550. The product devices are sawed apart and separated 555. Product is removed from the sawing tape and placed into trays 560. Product may be final tested, packed and shipped to the end user 565.

In another example embodiment, the "V" shaped profile may be accomplished with a photo-lithographic process. The front-side surface of the wafer substrate (containing the active devices) may be masked with a protective film. The back-side surface of the wafer substrate may be masked so as to leave exposed those areas corresponding to saw lanes of active devices. With a preferential etch, angled profiles, similar to those obtained with the sawing process discussed supra, may be achieved. The etching process may be a wet-etch, dry etch, or combination thereof.

Refer to FIGS. 6A-6F. A series of cross-sectional views illustrates the preparation of pedestal device die (i.e., a "mushroom" WLCSP). A silicon wafer 610 having undergone back-grinding, has active device die to which solder bumps 620 have been applied. A front-side tape 630 provides protection for the solder bumps 620, from the rigors of handling. With a saw blade 65 of a first kerf, and a sloped profile 640 (i.e. a pedestal slot), the back-side of the wafer is sawed in the locations corresponding to the active device saw lanes. With a saw blade 75 of a second kerf (narrower than the first kerf), the silicon wafer 610 is sawed into separate device die 615 each having a pre-determined number of solder bumps 625. The separated device die 615 now have angled edge profiles with recesses 645.

Figure 6A:
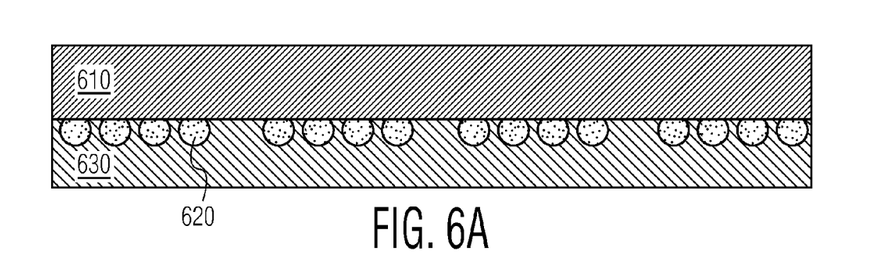
FIGS. 6A-6F illustrate the defining of a pedestal in an example WLCSP device according to an embodiment of the present disclosure.
Figure 6B:
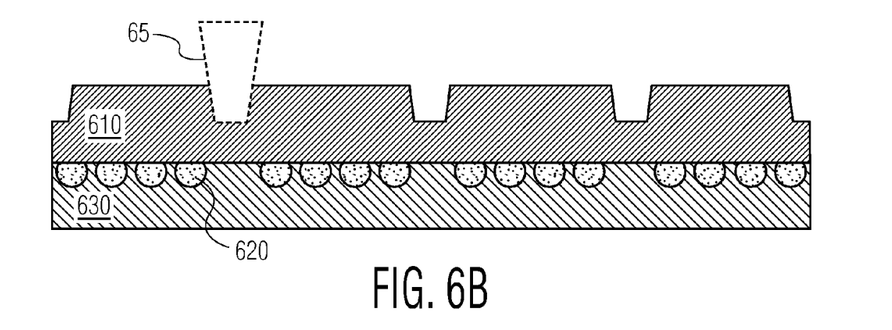
Figure 6C:
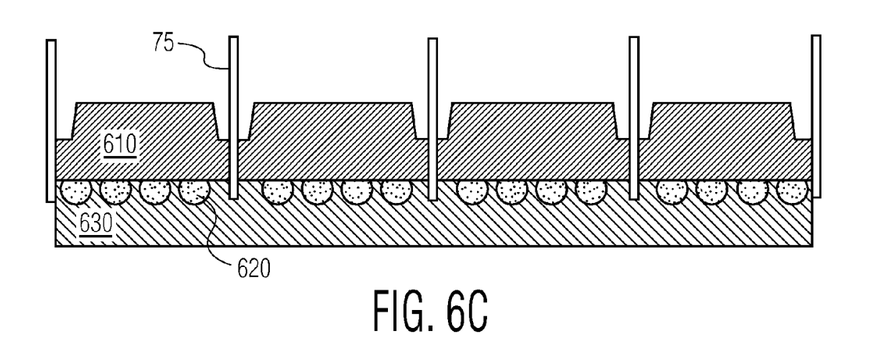
Figure 6D:
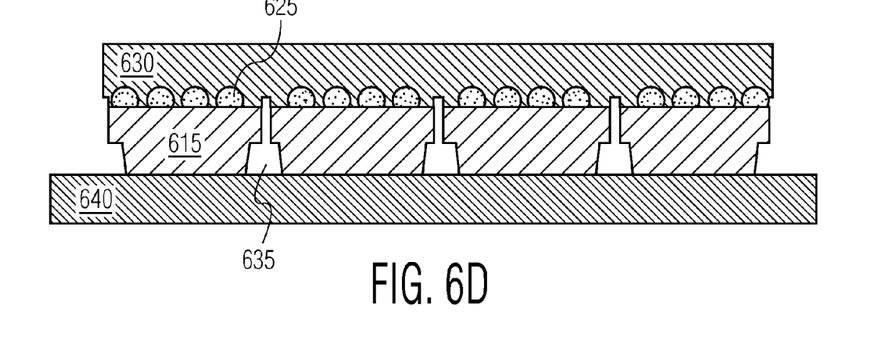
Figure 6E:
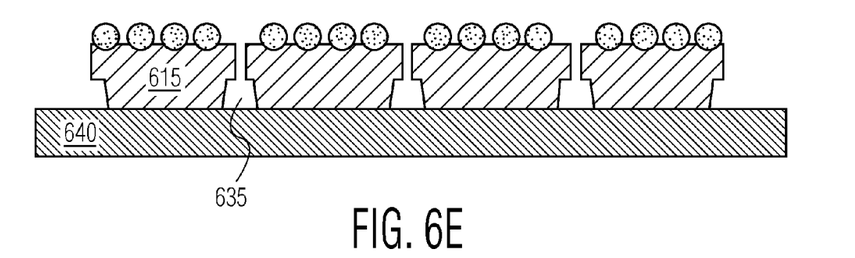
Figure 6F:
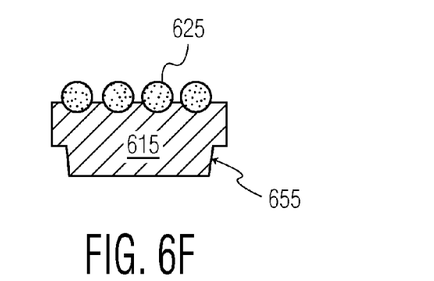

Having prepared the pedestal device die 615, having an angled profile with a recess 655, the user may select from a number of options in providing protection to the back-side surface of the die.

Figure 7A:
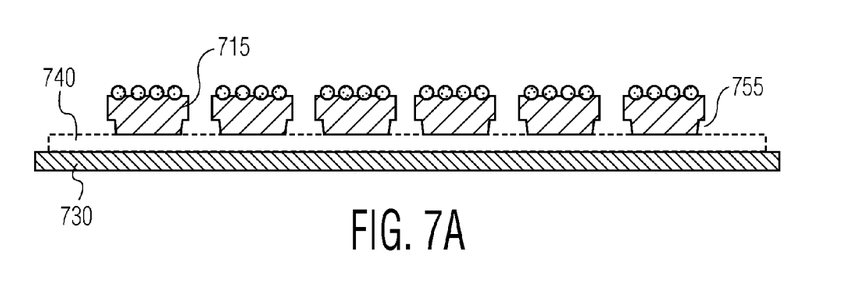
FIGS. 7A-7B illustrate the application of the protective material for a plurality of WLCSP device die as depicted in FIG. 6F.
Figure 7B:
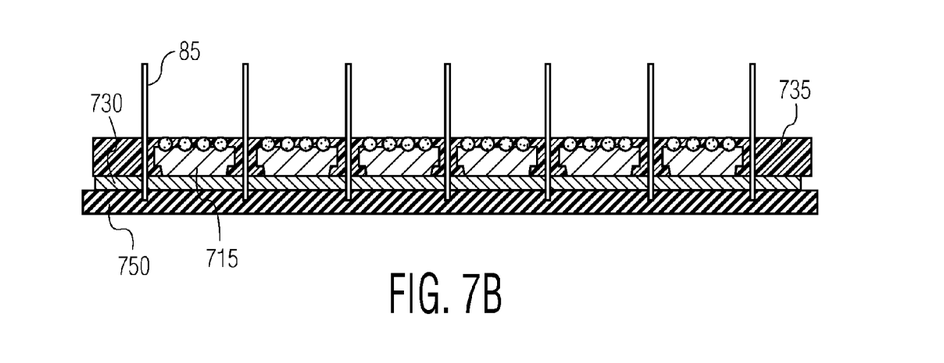

Refer to FIG. 7A. A plurality of pedestal die 715 may be mounted onto a material 730 that will ultimately provide the back-side protection. The material may be a plastic material such as epoxy molding compound (EMC) or be metal, such as copper, brass, nickel, tin, etc. or alloys, of one another. In another example process, the protective material 730 may have an optional second layer 740, so as to make a composite protective layer of metal 730 and molding compound 740. Refer to FIG. 7B. A molding compound 735 envelopes the plurality of device die 715. A protective film (not illustrated) covers the solder bumps from damage during encapsulation with molding compound 735. The pedestal profiles 755 of the plurality of device die 715 provides additional mechanical anchoring of the molding compound 735. The molded plurality of device die 715 is mounted onto a sawing/dicing film 750. A saw blade 85 of an appropriate kerf slices through the depths of the molding compound 735 and the protective layer 730. The plurality of device 715, now protected on five-sides, the back-side surface and the four vertical faces. In some example processes, it is possible to get molding compound on the front surface, as well by using a Foil Assisted Molding machine, FAM, and partially pushing the solder bumps into this film. In another process, compression molding technology may successfully apply molding compound onto the front surface and surround the solder bumps.

Having provided protection on the five surfaces of the device die substantially minimizes the likelihood of assembly damage by the end-user building his subsystems.

Figure 8A:
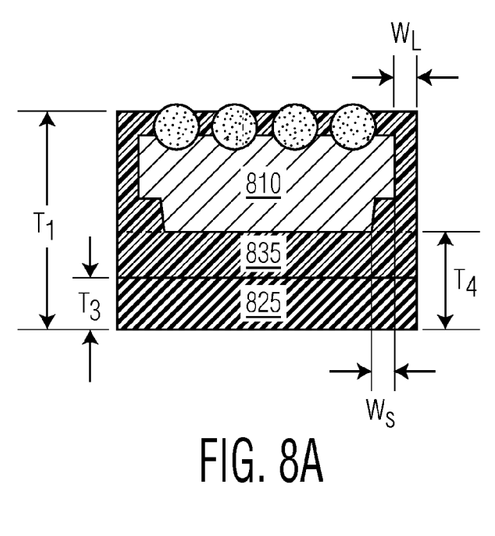
FIGS. 8A-8C depicts three example configurations of protective material applied onto the device die of FIG. 6F.
Figure 8B:
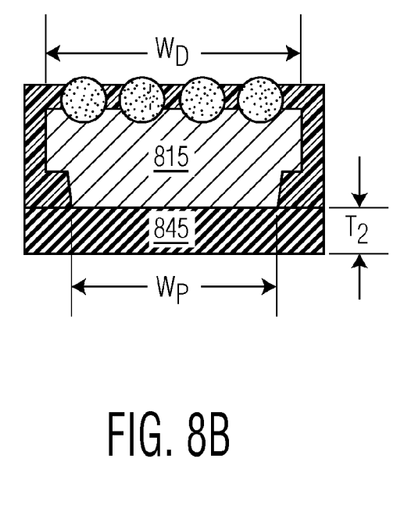
Figure 8C:
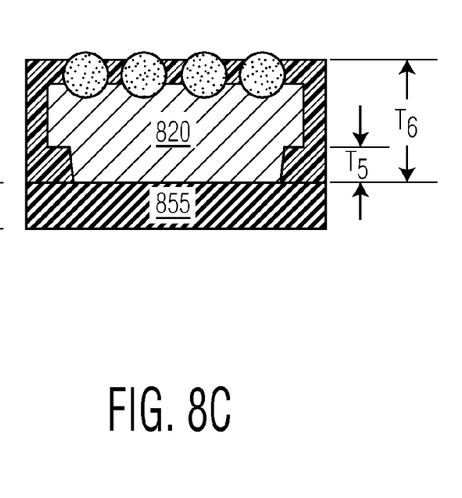

Refer to FIGS. 8A-8C. Three side views of device die having been encapsulated in a protective material are shown. FIG. 8A, device die 810 has protective material 835 of a molding compound enveloping the vertical faces and solder bump side 812 and back-side surface. An additional metal protective layer 825 is laminated to the molding compound 835 on the back-side surface. FIG. 8B, device 815 has molding compound 845 enveloping the vertical faces and the solder-bump side 822. On the back-side surface of device die 815 is a metal protective layer 855. FIG. 8C, device 820 only has molding compound 865 enveloping the vertical faces, backside, and solder bump side 832. The backside surface of device die 820 had only the molding compound 740, of FIG. 7A, applied in lieu of the metal layer 730; the additional molding compound 865 being applied in a further step. Depending upon the specific process, in an alternate embodiment, the solder-bumps may be shielded from the molding process and therefore, not be surrounded with molding compound in the finished product. The specific device die size may govern the feature sizes of the example techniques shown in FIGS. 8A-8C. Table 3 outlines some example device dimensions and their corresponding device die protection.

TABLE 3

Example Dimensions of Devices Assembled According to Disclosure (Dimensions in mm)

| FIG. | Die Size $W_D$ | Width of Protective layer on Vertical Faces $W_L$ | Width of Pedestal Slot Ws | Width of Die on Backside Surface $W_P$ | Depth of Pedestal Slot $T_P$ | Die Thickness $T_D$ | Overall Thickness $T_1$ | Thickness of First Layer of Protective Material $T_2$ | Thickness of $2^{nd}$ Layer of Protective Material $T_3$ | Overall Thickness of Protective Layer $T_4$ |
|---|---|---|---|---|---|---|---|---|---|---|
| 8A | 2.5 | 0.125 | 0.1 | 2.3 | 0.08 | 0.2 | 0.4 | 0.05 | 0.1 | 0.15 |
| 8A | 4.0 | 0.125 | 0.1 | 3.8 | 0.08 | 0.2 | 0.4 | 0.05 | 0.1 | 0.15 |
| 8A | 1 | 0.125 | 0.06 | .88 | 0.05 | 0.15 | 0.35 | 0.05 | 0.08 | 0.13 |
| 8B | 2.5 | 0.125 | 0.1 | 2.3 | 0.08 | 0.2 | 0.4 | 0.05 | 0 | N/A |
| 8B | 4.0 | 0.125 | 0.1 | 3.8 | 0.08 | 0.2 | 0.4 | 0.05 | 0 | N/A |
| 8B | 1 | 0.125 | 0.06 | .88 | 0.05 | 0.15 | 0.35 | 0.05 | 0 | N/A |
| 8C | 2.5 | 0.125 | 0.1 | 2.3 | 0.08 | 0.2 | 0.4 | 0.05 | 0 | N/A |
| 8C | 4.0 | 0.125 | 0.1 | 3.8 | 0.08 | 0.2 | 0.4 | 0.05 | 0 | N/A |
| 8C | 1 | 0.125 | 0.06 | .88 | 0.05 | 0.15 | 0.35 | 0.05 | 0 | N/A |

Numerous other embodiments of the invention will be apparent to persons skilled in the art without departing from the spirit and scope of the invention as defined in the appended claims.

The invention claimed is:

1. A method for assembling a WLCSP semiconductor device having contact areas defined thereon, the method comprising:
   defining a pedestal mounting strip per semiconductor device die thickness and surface area, the pedestal mounting strip have a topside and an underside;
   fabricating the pedestal mounting strip out of a molding compound, the pedestal mounting strip having a grid of pedestals on the topside, each one of the grid pedestals having a surface area smaller than the surface area of the underside of the semiconductor device;
   die attaching the semiconductor device onto the surface of each one of the grid pedestals, the semiconductor device forming an overhang on each one of the grid pedestals;
   protecting the contact areas with a release foil before encapsulating each one the WLCSP devices;
   encapsulating each one of the semiconductor devices on the pedestal mounting strip, assuring the encapsulant surrounds the semiconductor devices and flows under the overhang of each semiconductor device;
   removing the release foil after encapsulating each one of the WLCSP devices; and
   marking each one of the semiconductor devices in the corresponding position on the underside of the pedestal mounting strip.

2. The method as recited in claim 1, wherein the contact areas include, solder bumps, pad landings of solderable metal, copper/tin alloy.

3. A method for assembling a wafer level chip scale processed (WLCSP) device having solder bumps defined thereon, the method comprising:
   defining a pedestal mounting strip per WLCSP device die thickness and surface area, the pedestal mounting strip have a topside and an underside;
   fabricating the pedestal mounting strip out of a molding compound, the pedestal mounting strip having a grid of pedestals on the topside, each one of the grid pedestals having a surface area smaller than the surface area of the underside of the WLCSP device;
   die attaching the WLCSP device onto the surface of each one of the grid pedestals, the WLCSP device forming an overhang on each one of the grid pedestals;
   encapsulating each one of the WLCSP devices on the pedestal mounting strip, and assuring that the encapsulant surrounds the WLCSP devices and flows under the overhang of each WLCSP device;
   protecting the solder bumps with a release foil before encapsulating each one the WLCSP devices;
   removing the release foil after encapsulating each one of the WLCSP devices; and
   marking each one of the WLCSP devices in the corresponding position on the underside of the pedestal mounting strip.

4. The method as recited in claim 3, wherein during the fabricating of the pedestal mounting strip, a metal shield is attached to the underside.

5. The method as recited in claim 3 further comprising, singulating the encapsulated and marked WLCSP devices.

6. The method as recited in claim 3, wherein the pedestal mounting strip comprises an organic compound selected from the following: epoxy molding compound, polyimides.

7. The method as recited in claim 3 wherein each one of the grid pedestals is of a shape of a regular polygon of at least 3 sides.

8. The method as recited in claim 7, wherein the shape of each one of the grid pedestals is rectangular, square, or circular.

9. A semiconductor device assembled to resist mechanical damage, the semiconductor device comprising:
   an active circuit defined on a top surface and contact areas providing electrical connection to the active circuit, wherein the contact areas have solder bumps thereon;
   a release foil formed on the solder bumps before encapsulating the semiconductor device;

the release foil removed from the solder bumps after encapsulating the semiconductor device;

a pedestal structure upon which the active circuit is mounted on an bottom surface, wherein the pedestal structure has an area smaller than the area of the active device; and encapsulation consisting of a molding compound surrounding the sides and the underside of the active device and surrounding the solder bumps, wherein the encapsulation provides a resilient surface protecting the active device from mechanical damage.

10. The semiconductor device as recited in claim 9, wherein the pedestal structure is selected from one of the following:

directly formed onto a metal strip and the pedestal structure is integral to it;

the pedestal structure is separate piece which has been placed and attached to a metal substrate; and the pedestal structure is formed out of molding compound.

11. The semiconductor device as recited in claim 9, wherein the contact areas are solder bumps.

\* \* \* \* \*